US009406627B2

(12) United States Patent
Worley et al.

(10) Patent No.: US 9,406,627 B2
(45) Date of Patent: Aug. 2, 2016

(54) MIXED MODE RC CLAMPS

(71) Applicant: QUALCOMM Incorporated, San Diego, CA (US)

(72) Inventors: Eugene Robert Worley, Irvine, CA (US); Reza Jalilizeinali, Oceanside, CA (US); Sreeker Dundigal, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/038,663

(22) Filed: Sep. 26, 2013

(65) Prior Publication Data

US 2015/0084161 A1 Mar. 26, 2015

(51) Int. Cl.
H01L 27/06 (2006.01)
H01L 23/60 (2006.01)
H01L 27/02 (2006.01)
H02H 9/04 (2006.01)

(52) U.S. Cl.
CPC ............ *H01L 23/60* (2013.01); *H01L 27/0285* (2013.01); *H01L 27/0682* (2013.01); *H02H 9/046* (2013.01); *H01L 2924/0002* (2013.01)

(58) Field of Classification Search
USPC .................. 257/533, 516, E27.016, E27.017, 257/E27.024, E27.025, E27.045, E27.071
See application file for complete search history.

(56) References Cited

U.S. PATENT DOCUMENTS

| 5,708,549 | A | 1/1998 | Croft | |
|---|---|---|---|---|
| 7,164,185 | B1 | 1/2007 | Salman et al. | |
| 7,518,846 | B1 | 4/2009 | Meyer | |
| 8,238,067 | B2 | 8/2012 | Drapkin et al. | |
| 8,385,034 | B2 | 2/2013 | Lo | |
| 2004/0232492 | A1* | 11/2004 | Ker et al. | 257/355 |
| 2010/0321841 | A1 | 12/2010 | Worley et al. | |
| 2011/0261489 | A1 | 10/2011 | Zupcau | |
| 2013/0057993 | A1 | 3/2013 | Fukasaku | |
| 2013/0201586 | A1* | 8/2013 | Torres et al. | 361/56 |
| 2014/0133055 | A1* | 5/2014 | Parthasarathy et al. | 361/56 |
| 2014/0198415 | A1* | 7/2014 | Schulmeyer et al. | 361/56 |

OTHER PUBLICATIONS

International Search Report and Written Opinion—PCT/US2014/050162—ISA/EPO—Oct. 21, 2014.
Yeh C-T., et al., "High Area-Efficient ESD Clamp Circuit With Equivalent $RC$-Based Detection Mechanism in a 65-nm CMOS Process", IEEE Transactions on Electron Devices, IEEE Service Center, Piscataway, NJ, US, vol. 60, No. 3, Mar. 1, 2013, pp. 1011-1018, XP011494424, ISBN: 0018-9383, DOI: 10.1109/TED.2013.2241441.

* cited by examiner

*Primary Examiner* — Timor Karimy
(74) *Attorney, Agent, or Firm* — Seyfarth Shaw LLP

(57) ABSTRACT

A system interconnect includes a first resistor-capacitor (RC) clamp having a first RC time constant. The system interconnect also includes second RC clamps having a second RC time constant. The first and second RC clamps are arranged along the system interconnect. In addition, the first RC time constant is different from the second RC time constant.

10 Claims, 7 Drawing Sheets

MIXED MODE RC CLAMPS

TECHNICAL FIELD

The present disclosure generally relates to integrated circuits (ICs). More specifically, the present disclosure relates to mixed mode resistor-capacitor (RC) clamps used to protect against electrostatic discharge (ESD).

BACKGROUND

Clamps are circuits that are used to protect against electrostatic discharge (ESD) in electronic devices. Clamps are so named because they fix or "clamp" the positive or negative peak variations of a voltage signal to a defined value by shunting the ESD discharge current. The timing elements of transient clamps may be implemented by using resistors and capacitors (RC). Such clamps are referred to as RC clamps. RC clamps have a number of advantages over other types of clamps including process portability, ease of simulation with standard metal oxide semiconductor field effect transistor (MOSFET) models, faster response times and lower conduction offset voltages.

RC clamps may use two main electrostatic discharge models to determine their RC time constant values. The first model is the human body model (HBM), which sets a high RC time constant value for the RC clamp. The second model is the charged device model (CDM), which sets a RC time constant value that is lower than the one set by the human body model. The human body model may be used to calculate the RC time constant values of RC clamps. Unfortunately, the RC components for meeting these RC time constant values may take up nearly half of the entire layout area of the overall RC clamp.

SUMMARY

In one aspect of the present disclosure, a system interconnect includes at least one first resistor capacitor (RC) clamp having a first RC time constant. The system interconnect also includes second RC clamps having a second RC time constant. The first and second RC clamps are arranged along the system interconnect. The first RC time constant is different from the second RC time constant.

Another aspect discloses a method of fabricating a resistor capacitor (RC) clamp network circuit. The method includes arranging at least one first RC clamp in a system interconnect, the at least one first RC clamp having a first RC time constant. The method also includes coupling a set of second RC clamps to the at least one first RC clamp. The set of second RC clamps has a second RC time constant different than the first RC time constant.

In yet another aspect, a system interconnect is disclosed. The system interconnect includes a first means for clamping a voltage having a first RC time constant and a second means for clamping a voltage having a second RC time constant. The first and second clamping means are arranged along the system interconnect. The first RC time constant is different from the second RC time constant.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Clamps limit or "clamp" the positive or negative peak variations of a voltage signal by shunting the ESD. In an ESD, there is no DC current, only a transient current pulse. Clamps may be implemented by using resistors and capacitors (RC). Such clamps are referred to as RC clamps. RC clamps may use two main electrostatic discharge models to determine their RC time constant values: the human body model (HBM) and the charged device model (CDM). The human body model sets a high RC time constant value for the RC clamp. The charge device model, however, sets a RC time constant value that is lower than the one set by the human body model. The human body model is generally used to calculate the RC time constant values of RC clamps. For example, to meet the RC time constant values of the human body model, the layout area of the RC components may be large. In some instances, the resistors and capacitors take up nearly half of the entire layout area of the overall RC clamp. Therefore, it may be beneficial to derive a RC clamp design that meets the conditions of the human body model, while minimizing the layout area of the RC clamp.

For instance, because the charged device model uses RC components with smaller layout areas, a RC clamp design using the human body model may incorporate charged device model elements to reduce the RC clamp's overall layout area. Such a RC clamp design conserves resources, has faster response times and also exhibits efficient power consumption with lower voltage values.

In one aspect of the disclosure, a system interconnect is described. The system interconnect includes at least one first RC clamp having a first RC time constant. The system interconnect also includes a set of second RC clamps having a second RC time constant. The set of first and second RC clamps may also be arranged along the system interconnect, with the first RC time constant being different from the second RC time constant. The at least one first RC clamp may be a human body model RC clamp, and the set of second RC clamps may be charged device model RC clamps.

Figure 1:
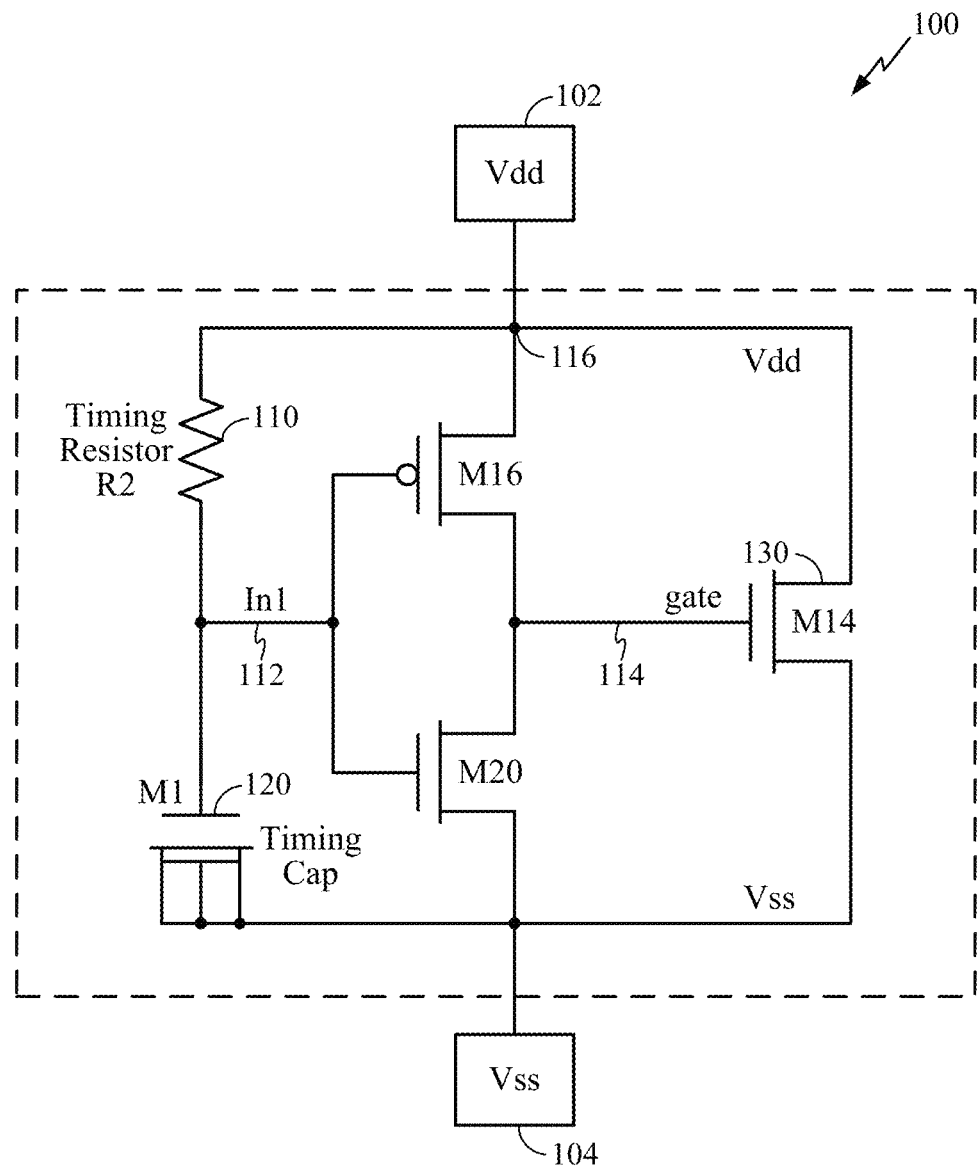
FIG. 1 is a schematic diagram of a RC clamp design according to an aspect of the present disclosure.

FIG. 1 is a schematic diagram of a RC clamp design 100 according to an aspect of the present disclosure. In normal operation, a timing resistor (R2) 110 keeps an internal node 112 close to the voltage level of a power supply terminal 102 (Vdd). The internal node 112 triggers the actions of an inverter, which may be made up of a transistor M16 and a transistor M20. This also keeps a gate node 114 of a transistor M14 130 at the voltage level of a ground terminal (Vss) 104, which keeps the transistor M14 130 off (e.g., non-conducting). As time passes, the timing resistor 110 raise the voltage across (also known as "pulling up") a timing capacitor M1 120 to the voltage level of the power supply terminal 102. In one implementation, the timing resistor 110 may be a polysilicon resistor. In one implementation, the timing resistor 110 may be a transistor (such as a MOSFET) biased as a resistor.

The pulling up of the timing capacitor M1 120 to the voltage level of the power supply terminal 102 changes the voltage of the internal node 112 to a high voltage, which turns on the transistor M20. Once the transistor M20 is turned on, the voltage of the ground terminal 104 feeds into the gate node 114 of the transistor M14 130. This shuts off the transistor M14 130.

During electrostatic discharge, the overall RC clamp is unpowered so that the charge on the timing capacitor M1 120 is zero, and the voltage is also zero. Electrostatic discharge transients appear on the power supply terminal 102 cause the voltage between the power supply terminal 102 and the ground terminal 104 rapidly (e.g., in a few nanoseconds or less). The timing capacitor M1 120 keeps the voltage of the internal node 112 at zero volts, momentarily. The inverter, including the transistors M16 and M20, outputs a voltage on the gate node 114 at the voltage level of the power supply terminal 102, which turns on the large shunt transistor M14 130.

The RC time constant is designed to keep the transistor M14 130 on through the electrostatic discharge. The transistor M13 will stay on, shunting the electrostatic discharge current until the RC timer voltage on the internal node 112 goes to the voltage level of the power supply terminal 102 via the timing resistor 110, which shuts off the transistor M14 130. Under a normal voltage ramp up on the power supply terminal 102, the RC time constant may be too short to turn on a transistor M14 130. As a result, the power supply terminal 102 is prevented from seeing a near short condition under the application of normal power.

The RC clamp design 100 stabilizes the voltage range between the power supply terminal 102 and the ground terminal 104. The timing capacitor M1 120, which may be implemented as a transistor (as shown), holds an internal node 112 at a low voltage value. This feeds into the gate of a transistor M16 and turns on the transistor M16. Once the transistor M16 is on, the power supply terminal 102 is coupled to a gate node 114 of a transistor M14 130, thereby turning on the transistor M14 130. The transistor M14 130 is designed to absorb the current flow during electrostatic discharge, which maintains a reduced voltage range between the power supply terminal 102 and the ground terminal 118. The transistor M14 130 is also known as the electrostatic discharge current shunt transistor because it shunts current caused by electrostatic discharge that flows from the power supply terminal 102 to the ground terminal 118.

The transistors M16 and M20 also constitute an inverter. In one implementation, the RC clamp design 100 may have three inverters instead of one inverter, as shown in FIG. 1.

Also during power-up of the RC clamp design 100, a power supply node 116 located directly above the transistor M16 experiences a rise on the order of several or more microseconds (μs). Under the human body model for electrostatic discharge, a RC time constant value is selected to reflect this slower rise time. During the rise time, the timing resistor 110 charges the timing capacitor M1 120 to keep the voltage of the internal node 112 at the same level as the voltage of the power supply node 116. This keeps the transistor M20 on and turns off the transistor M14 130. A typical RC time constants may be around 1 μs. Again, this RC time constant is usually set by the human body model test specification for electrostatic discharge. Another electrostatic discharge specification test performed on RC clamps is the charged device model, which usually has a much shorter time constant.

Figure 2:
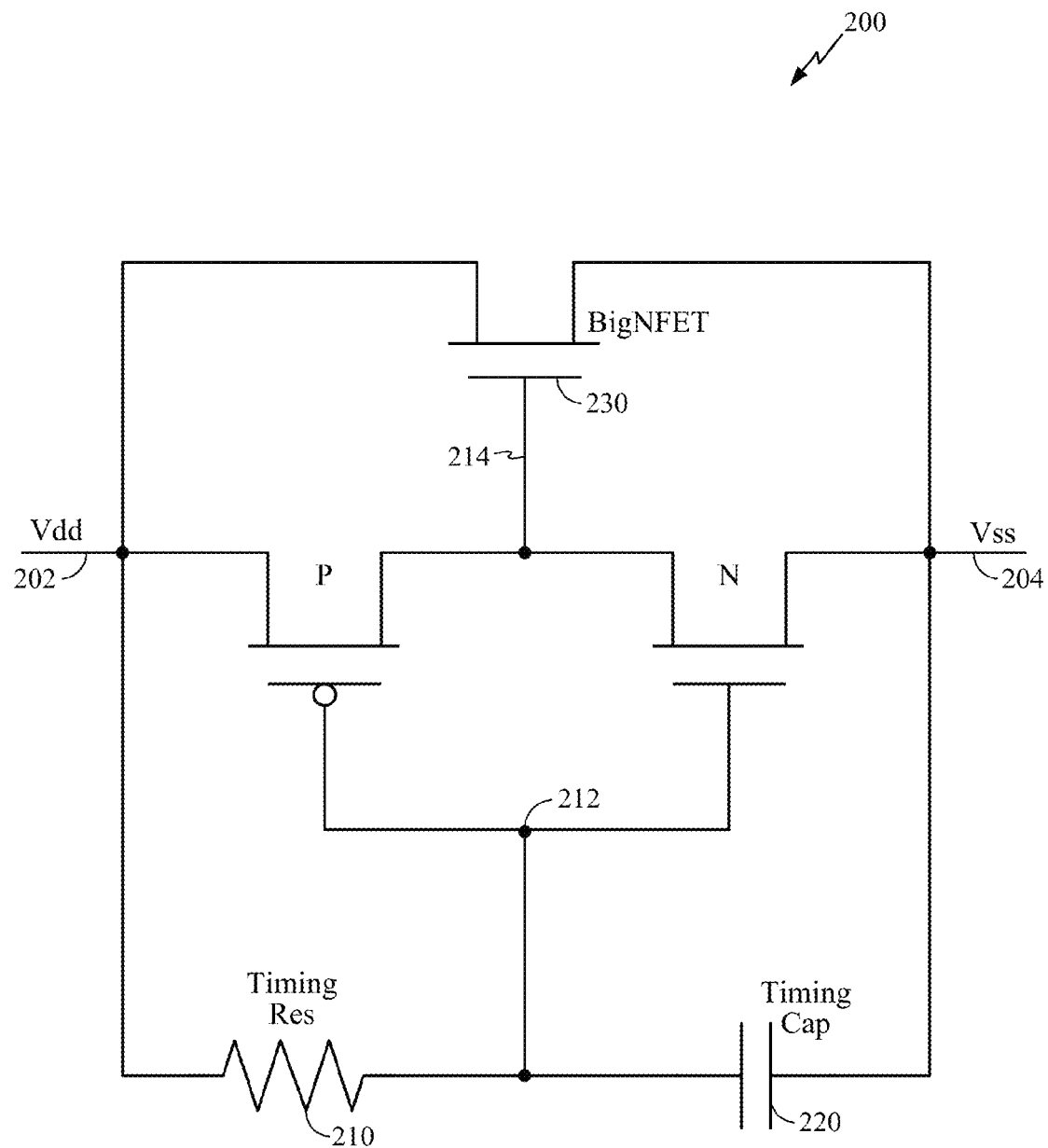
FIG. 2 is a schematic diagram of a RC clamp design according to an aspect of the present disclosure.

FIG. 2 is a schematic diagram of a RC clamp design 200 according to an aspect of the present disclosure. The RC clamp design 200 is similar to RC clamp design 100 of FIG. 1, but rotated 90 degrees counter-clockwise, and with some other minor differences. Therefore, the operation of RC clamp design 200 is similar to the operation of RC clamp design 100. For example, a power supply (Vdd) terminal 202, a ground terminal (Vss) terminal 204, a timing resistor 210, an internal node 212, a transistor P, a transistor N, a gate node 214 and a BigNFET transistor 230 are similar to the power supply terminal 102, the ground terminal 104, the timing resistor 110, the internal node 112, the transistor M16, the transistor M20, the gate node 114 and the transistor M14 130, respectively, of RC clamp design 100. A timing capacitor 220 is similar to the timing capacitor M1 120 of RC clamp design 100, but is represented as a capacitor instead of a transistor.

Each RC clamp (such as RC clamp designs 100 and 200 of FIGS. 1 and 2, respectively) has a corresponding RC time constant. The RC clamp designs 100 and 200 may be configured for a human body model or a charged device model. The human body model or charged device model is then used to calculate the RC time constant of an RC clamp. Calculating the RC time constant for the RC clamp may involve the multiplication of the timing resistor (110 and 210) with the timing capacitor (M1 and 220) to derive a product that becomes the RC time constant value. Usually, the human body model calculates a higher RC time constant value for a RC clamp, which may use larger resistance and capacitance values. The charged device model sets a RC time constant value that is shorter and faster than the RC time constant set by the human body model.

For example, an RC time constant associated with the charged device model discharge is less than or around one nanosecond, whereas another RC time constant associated with the human body model discharge may be around 150 nanoseconds or higher. The charged device model also usually has a much higher current amplitude than the human body model. The human body model also may dissipate more energy than the charged device model.

Figure 3:
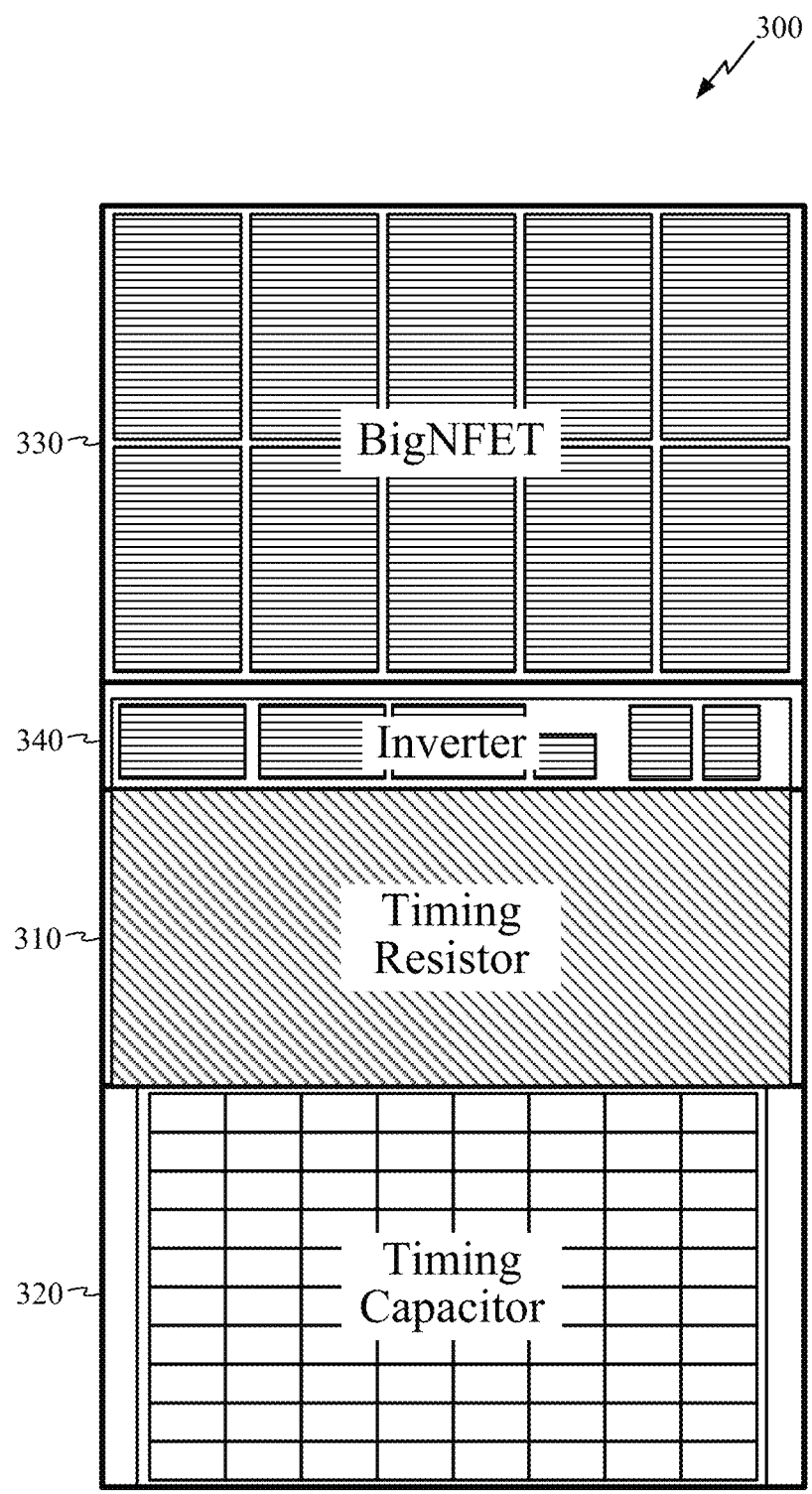
FIG. 3 is a layout diagram of a RC clamp design according to an aspect of the present disclosure.

Because the human body model results in a much higher RC time constant value, the layout areas of the resistor and capacitor components of the RC clamp may be large (e.g., taking 50% or more of the total layout area) especially when compared to the remaining components of the RC clamp, as can be seen in FIG. 3. As a result, the layout efficiency—which is defined as the layout area of the shunt transistor M14 130 of RC clamp design 100 or the BigNFET transistor 230 of RC clamp design 200 over the total layout area of the entire RC clamp—is less than 50%, mainly due to the large layout areas of the resistor and capacitor elements.

The maximum current through the RC clamp is usually highest at the onset of any human body model electrostatic discharge event. The current through the RC clamp may be close to 100% of the peak current at a very short time (e.g., a few nanoseconds) after the electrostatic discharge event starts, and often tapers down within a few hundred nanoseconds. For a 1 kV discharge, a peak current may be on the order of 700 milliamps, which may drop a few tenths of a volt across a bus having low resistance. Damage in a protected device tends to occur at the front end or earlier moments of a human body model electrostatic discharge.

Damage to MOSFET devices often occurs in the gate oxide dielectrics, as these areas of the devices are very voltage and current sensitive. The gate dielectric tends to rupture at higher voltages, or if exposed to high currents for extended periods of time. RC clamp design tends to favor keeping the overall voltage low and minimizing the time of high current flow. Therefore, a tradeoff between time, voltage level and current level is necessary to derive an effective RC clamp design.

Because the charged device model RC time constant or discharge time is brief (e.g., less than or around one nanosecond) the RC clamp layout for charged device model can be designed to have a layout area that is much smaller (even smaller by a factor of 100) than the layout design for human body model. Therefore, one possibility is to have two RC clamp types in one RC clamp design: one RC clamp with a shorter, faster charged device model RC time constant and another with a larger, slower human body model RC time constant. Such a RC clamp design may be implemented on a single power bus, with a lot of charged device model RC clamps with short RC time constants and a fewer amount of human body model RC clamps with longer RC time constants. As a result, the RC components of most clamps on a given power bus have a small layout area, whereas some RC components of a few clamps have a slightly larger layout area. This reduces the total layout area of the overall RC clamp design.

FIG. 3 is a layout diagram of a RC clamp design 300 according to an aspect of the present disclosure. The RC clamp design 300 also uses the human body model for calculating the RC time constant value for RC clamp design 300. The RC clamp design 300 may be the layout version of RC clamp design 200 of FIG. 2 or RC clamp design 100 of FIG. 1. For instance, the BigNFET layout 330 is the layout of the BigNFET transistor 230 in RC clamp design 200, or the transistor M14 130 in RC clamp design 100. Furthermore, the inverter layout 340 is the layout of the inverter that includes the internal node 212 and the P and N transistors of RC clamp design 200, as well as the internal node 112 and the transistors M16 and M20 of the RC clamp design 100. The timing resistor layout 310 is the layout of the timing resistor 210 from the RC clamp design 200 and the timing resistor 110 from the RC clamp design 100. The timing capacitor layout 320 is the layout of the timing capacitor 220 from the RC clamp design 200 and the timing capacitor M1 120 from the RC clamp design 100.

The layout area of the RC components (the timing resistor layout 310 and the timing capacitor layout 320) take up a large percentage of the overall layout area of the RC clamp design 300. This happens because the RC time constant values for a RC clamp calculated via the human body model are usually higher, especially when compared to RC time constant values calculated by the charged device model. As can also be seen by the layout diagram of the RC clamp design 300, the inverter layout 340 does not take that much space out of the overall RC clamp layout area. In one implementation, the layout area of the BigNFET layout 330 may be variable. Examples of timing resistor values include 2Ω, 0.63Ω, a total bus resistance value of 0.8Ω (e.g., with 0.2Ω assigned to each bus resistor), and a total bus resistance value of 1.6Ω. Examples of timing capacitor values include 100 pF.

In one implementation, a RC clamp implemented with the human body model RC time constants can be made up of two smaller sub-RC clamps and thus would have a dual RC time constant configuration. One of the sub-RC clamps can have a shorter time constant, and the other sub-RC clamp can have a longer time constant. The two sub-RC clamps would shunt the high current that the human body model RC clamp initially experiences. As the current dissipates, one of the sub-RC clamps may be on, and the other sub-RC clamp can shut off. This dual sub-RC clamp implementation may also take up less layout area.

RC clamps may be designed to meet the human body model specification with a larger RC time constant, and are not often designed to meet the charged device model specification. This occurs because the human body model RC clamps have higher voltages, lower currents and a longer time period for its RC time constant. For the charged device model, it is the opposite: lower voltages, higher currents and a shorter time period for its RC time constant, resulting in a lower RC time constant for the charged device model RC clamps.

In one implementation, one human body model RC clamp may be used for a 1 kV human body model discharge voltage. In one implementation, there is one charged device model RC clamp that may absorb most of the energy of the human body model discharge. Another human body model RC clamp may be used to shunt a weak back-end current. The human body model RC clamp in this case would not have placement issues because voltage drops across the power bus would be small, especially for a 1 kV human body model discharge voltage.

Figure 4:
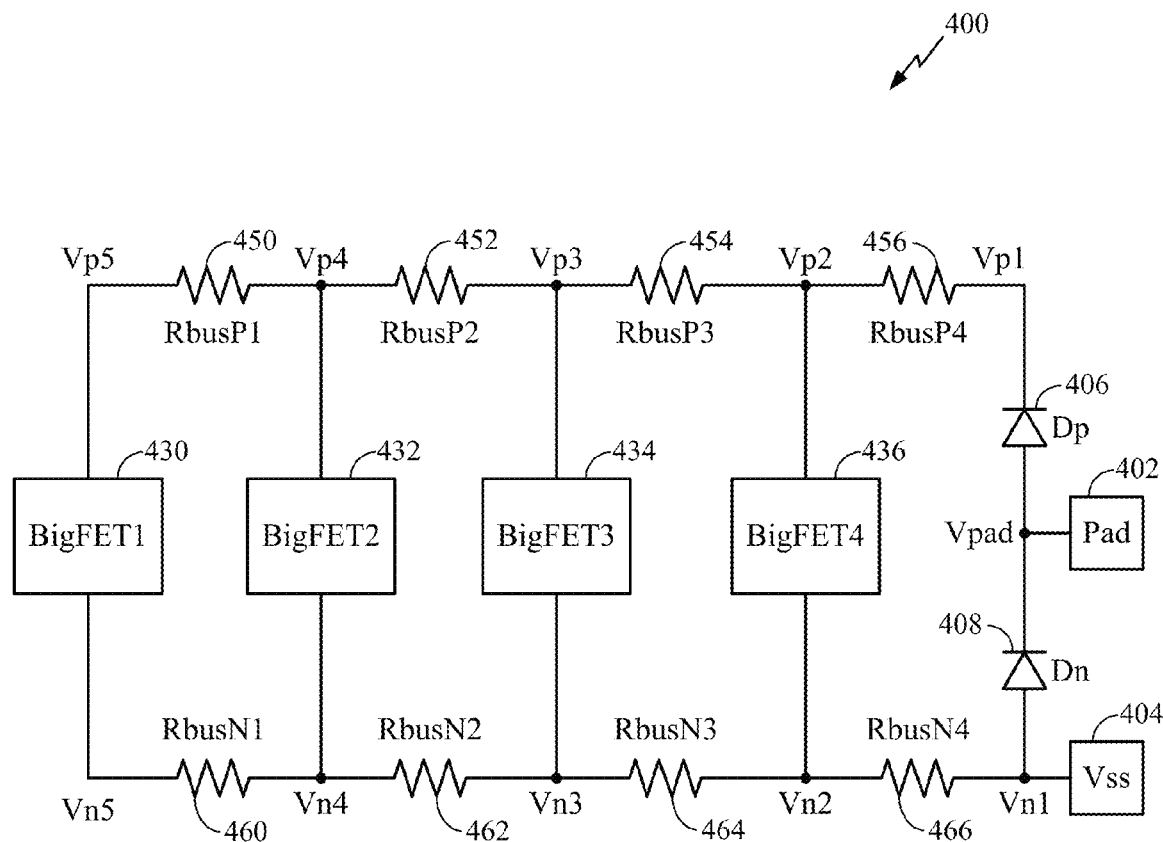
FIG. 4 is a schematic diagram of a RC clamp network circuit according to an aspect of the present disclosure.

FIG. 4 is a schematic diagram of a RC clamp network circuit 400 according to an aspect of the present disclosure. The RC clamp network circuit 400 distributes a number of RC clamps 430, 432, 434 and 436 on a power bus, which is represented by the components 450-456, Vp1-Vp5 and 460-466, Vn1-Vn5. Multiple RC clamps are distributed along the power bus from the power supply terminal pad 402 to the ground terminal pad 404 (Vss) to reduce the effect of bus resistance in limiting the overall shunting ability of the electrostatic discharge network.

In one implementation, the RC clamp 430 may be a human body model RC clamp, and the RC clamps 432, 434 and 436 may be charged device model RC clamps. In this case, the RC clamp 430 labeled "BigFET1" has a long human body model discharge time constant while the other three RC clamp BigFETs—BigFET2 (432), BigFET3 (434), and BigFET4 (436)—have shorter time constants. This time constant assignment may be worst case because the BigFET used for the complete discharge of the human body model pulse (Big-FET1 or RC clamp 430) has the greatest bus resistance in its discharge path.

The RC clamps 430, 432, 434 and 436 are used to shunt current from the power supply terminal pad 402 to the ground terminal pad 404 with an electrostatic discharge stress source applied between these two terminals. The easier discharge path is current flowing from the ground terminal pad 404 through the ground diode (Dn) 408 and finally to the power supply terminal pad 402. The more difficult discharge path is the positive discharge path where current flows from the power supply terminal pad 402, through the pad diode (Dp) 406 and through all the components 450-456, Vp1-Vp5, 460-466 and Vn5-Vn1 to finally reach the ground terminal pad 404. This positive discharge path is caused by a positive discharge into the power supply terminal pad 402 and also produces a high stress voltage.

The positive discharge path starts from the power supply terminal pad 402, flows through the pad diode 406, and then flows from node Vp1 to the ground terminal pad 404 or "Vss" via the RC clamps 430, 432, 434 and 436. Resistors are distributed along the RC clamp terminals for RC clamps 430-436 to represent bus resistance. The bus resistance is often uniformly distributed among the RC clamps 430-436 and represents the bus resistance between the two terminals of the power supply terminal pad 402 and the ground terminal pad 404.

In one implementation, the current flow may also proceed from Vp1 to RbusP4 resistor 456, Vp2, RbusP3 resistor 454, Vp3, RbusP2 resistor 452, Vp4, RbusP1 resistor 450, Vp5 and then RC clamp 430. Then it continues its flow from the RC clamp 430 to Vn5, the RbusN1 resistor 460, Vn4, the RbusN2 resistor 462, Vn3, the RbusN3 resistor 464, Vn2, the RbusN4 resistor 466, Vn1 and then finally to the ground terminal pad 404. In one implementation, the value of the total bus resistance could be 0.8Ω, and each of the bus resistors may have a value of 0.2Ω. In this case, the total bus resistance from Vp1 to Vp5 and from Vn5 to Vn1 is 1.6Ω.

In one implementation, instead of a charged device model RC clamp used for most of the RC clamps 430-436 of RC clamp network circuit 400, a very fast transmission line pulsed (VFTLP) source may be used as the RC clamp. The VFTLP source is similar to a charged device model source in terms of peak current, current rise time, and source impedance.

The values also vary when observing the percentage of total current distribution for the RC clamps 430, 432, 434 and 436 over time. The distribution of the percentage of shunt current can also be observed to be a function of the position of the particular RC clamp. For the initial current, the RC clamp 436 that is nearest to the pad diode 406 may shunt a larger percentage of the electrostatic discharge current. The RC clamp with the most series bus resistance may still provide adequate shunting after the other three RC clamps have shut off. As such, there may not be any placement restriction on a particular RC clamp with the longer time constant even for relatively large bus resistances.

The values also vary when observing the voltages for activity of the RC clamps 430, 432, 434 and 436. In one implementation, the first peak voltage corresponding to the first peak discharge current may be a relatively flat plot. In one implementation, the second peak current due to the shut off of RC clamps 432, 434 and 436 may be a curve with a slight downwards slope. There may be no benefit in making the time constants of the RC clamps 432, 434 and 436 larger than a certain value, because the majority of the current has been passed, but may provide some benefit in lowering the residual voltage.

In one implementation, one RC clamp with a long time constant may be used and also located anywhere on a power bus, even for the case where the total power bus resistance is relatively high. This allows the other RC clamps that are used for the charged device model to have shorter time constants, thereby reducing the area specified for these RC clamps. Furthermore, the charged device model RC clamps can be designed with significantly lower time constants. At these lower time constants can absorb at least some of the energy of the human body model pulse while reducing the area of the overall RC clamp layout, including the layout for the human body model RC clamp.

Figure 5:
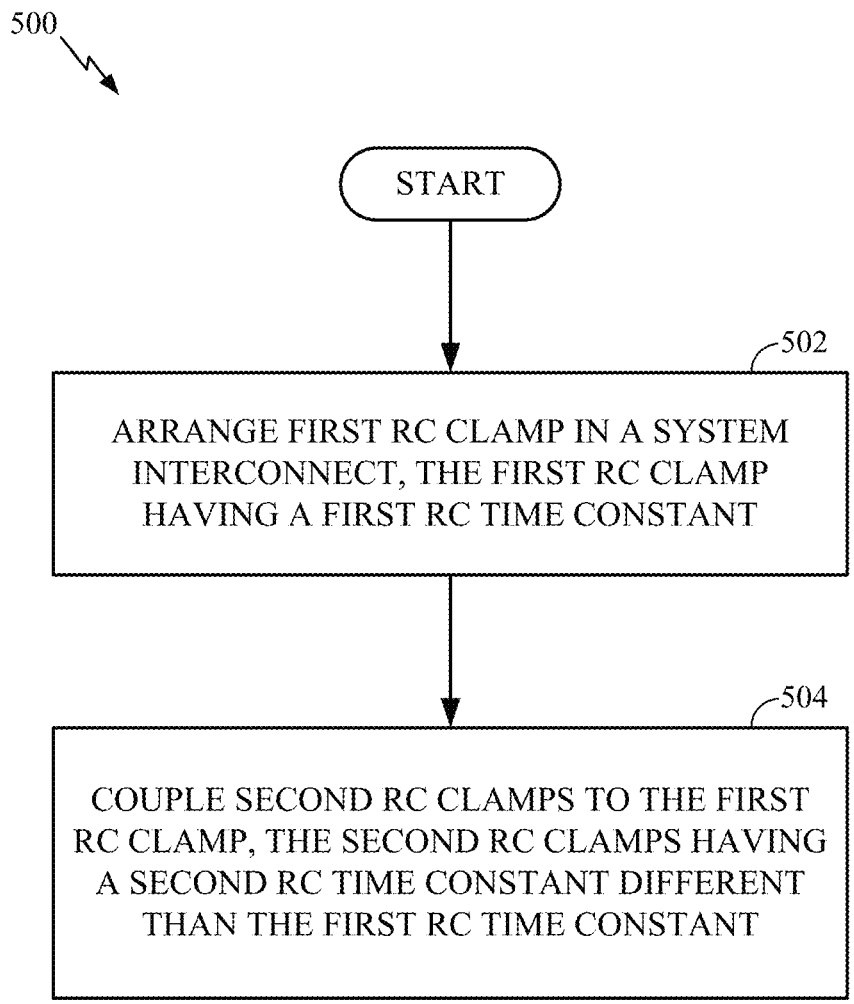
FIG. 5 is a process flow diagram illustrating a method of making a RC clamp network circuit according to an aspect of the present disclosure.

FIG. 5 is a process flow diagram illustrating a method 500 of making a RC clamp network circuit according to an aspect of the present disclosure. In block 502, first RC clamp is arranged in a system interconnect. The first RC clamp has a first RC time constant. For example, the first RC clamp may be RC clamp designs 100, 200 or 300 configured for the human body model. The first time constant may also be the RC time constant resulting from the human body model configuration. In block 504, second RC clamps are coupled to the at least one first RC clamp. The second RC clamps have a second RC time constant different than the first RC time constant. For example, the plurality of second RC clamps may be RC clamps such as RC clamp designs 100 or 200, but configured for the charged device model. The second time constant may also be the RC time constant resulting from the charged device model configuration, which may be lower than the time constant resulting from the human body model configuration. The end result of method 500 may be the RC clamp network circuit 400 of FIG. 4.

Although blocks are shown in a particular sequence, the present disclosure is not so limited. For example, block 504 (coupling a plurality of second RC clamps to the at least one first RC clamp) may be performed prior to block 502 (arranging at least one first RC clamp in a system interconnect) in that the plurality of second RC clamps are arranged directly within the system interconnect.

According to a further aspect of the present disclosure, circuitry for system interconnects using RC clamps is described. The system interconnect includes first means for clamping a voltage having a first RC time constant. The system interconnect may be the RC clamp network circuit 400 of FIG. 4. Also, the first means for clamping the voltage having the first RC time constant may be RC clamp designs 100, 200 or 300 configured for the human body model. The system interconnect further includes second means for clamping a voltage having a second RC time constant. For example, the second means for clamping the voltage having the second RC time constant may be RC clamp designs 100 or 200, configured for the charged device model. The first means and second means for clamping voltage may be arranged along the system interconnect. The first RC time constant may also be different from the second RC time constant. In one implementation, the first and second means for clamping voltage may clamp the voltage of the system interconnect.

In this configuration, the means for clamping voltage may also include at least one means for storing charge (e.g., the timing capacitor M1 120 in FIG. 1, the timing capacitor 220 in FIG. 2 and the timing capacitor layout 320 in FIG. 3), at least one means for implementing electrical resistance (e.g., the timing resistor 110 in FIG. 1, the timing resistor 210 in FIG. 2, the timing resistor layout 310 in FIG. 3, and the resistors 450-456 and 460-466 in FIG. 4), and at least one means for switching electrical signals (e.g., transistors M14 130, M16 and M20 in FIG. 1, transistors N, P and the BigNFET transistor 230 in FIG. 2, the BigNFET layout 330 in FIG. 3, and the RC clamps 430, 432, 434 and 436, as well as the pad diode 406 and the ground diode 408 in FIG. 4).

Figure 6:
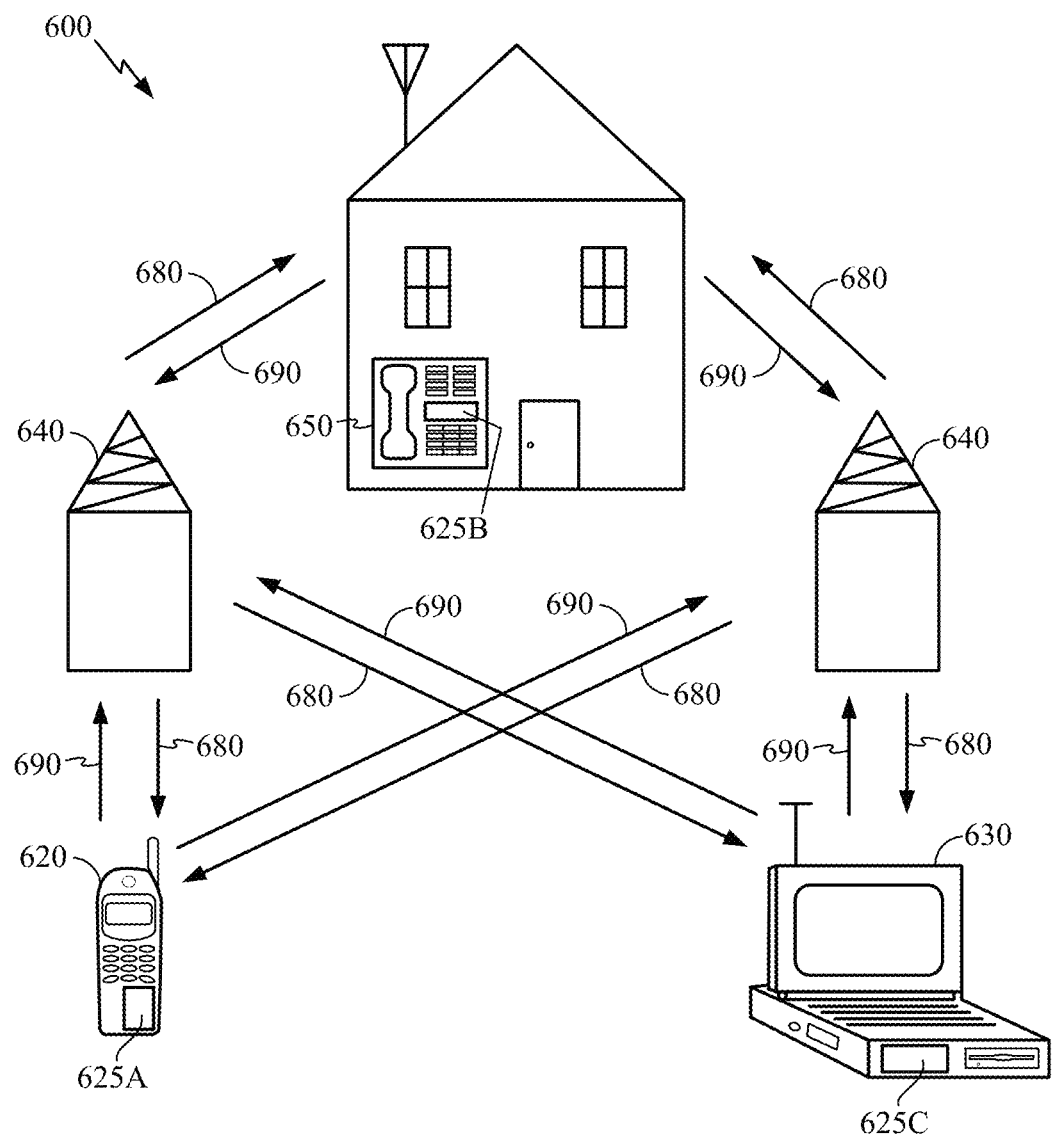
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed RC clamps. It will be recognized that other devices may also include the disclosed diplexer devices, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed RC clamps.

Figure 7:
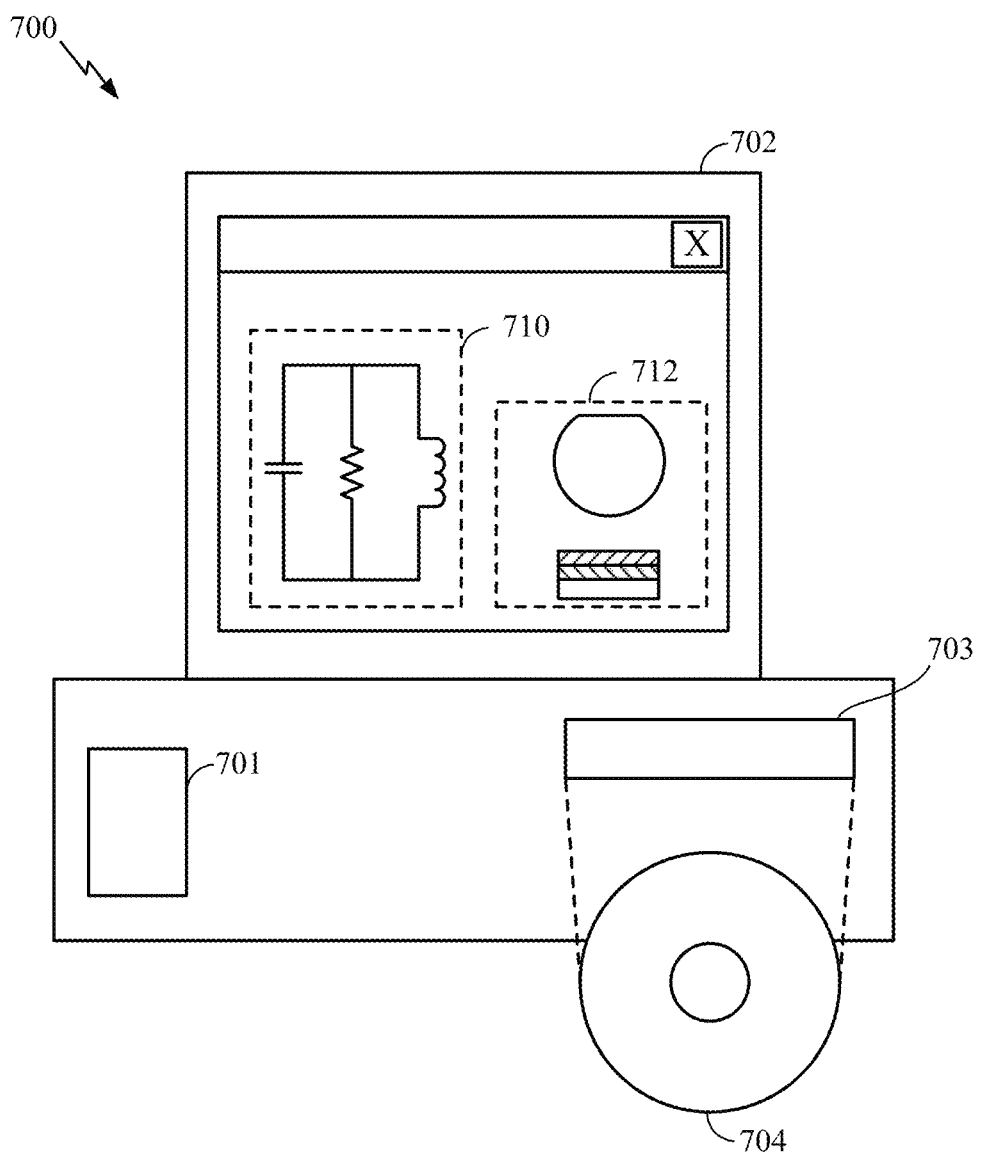
FIG. 7 is a block diagram illustrating a design workstation used for circuit, layout, and logic design of a semiconductor component according to one configuration.

FIG. 7 is a block diagram illustrating a design workstation used for circuit, layout, and logic design of a semiconductor component, such as the RC clamps disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a RC clamp. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A passive mixed mode resistor-capacitor (RC) clamp device system, comprising:
a RC clamp device configured according to a human body model (HBM) to determine a first RC time constant of the RC clamp device, the RC clamp device configured to include sub-RC clamp components configured according to a charged device model (CDM) to determine a second RC time constant of the RC clamp device to reduce the overall layout area of the RC clamp device, the first RC time constant configured to accommodate HBM electrostatic discharge (ESD) and the second RC time constant configured to accommodate CDM-ESD;

a system power bus along which the RC clamp device and the sub-RC clamp components are arranged, the first RC time constant being different from the second RC time constant, the first and second RC time constants defined based at least in part on first and second resistance and capacitance values, respectively, in which the first resistance and capacitance values are larger relative to the second resistance and capacitance values, the first RC time constant defined to reflect a slower rise time relative to the second RC time constant;

a first initial power supply signal and a second initial power supply signal to shunt high current initially experienced by the RC clamp device, the first initial power supply signal configured to turn on components configured according to the HBM model, the second initial power supply signal configured to turn on the sub-RC clamp components; and a delayed power supply signal configured to turn off the components configured according to the HBM model after the initial experience of the high current by the RC clamp device to continue shunting the current through the sub-RC clamp components.

2. The passive mixed mode resistor-capacitor (RC) clamp device system of claim 1, in which the first RC time constant is greater than the second RC time constant.

3. The passive mixed mode resistor-capacitor (RC) clamp device system of claim 1, in which the at least one first RC clamp further comprises another sub RC clamp having a third RC time constant.

4. The passive mixed mode resistor-capacitor (RC) clamp device system of claim 3, in which the first RC time constant, the second RC time constant and the third RC time constant reduce a layout area of one of the first and second RC clamps along the system power bus.

5. The passive mixed mode resistor-capacitor (RC) clamp device system of claim 1, in which the at least one first RC clamp and the plurality of second RC clamps each comprise at least one transistor, the at least one transistor having a variable layout area.

6. The passive mixed mode resistor-capacitor (RC) clamp device system of claim 1 integrated into a mobile phone, a set top box, a music player, a video player, an entertainment unit, a navigation device, a computer, a hand-held personal communication systems (PCS) unit, a portable data unit, and/or a fixed location data unit.

7. A passive mixed mode resistor-capacitor (RC) clamp device system, comprising:

a RC clamp device configured according to a human body model (HBM) to determine a first RC time constant of the RC clamp device, the RC clamp device to include sub-RC clamp components configured according to a charged device model (CDM) to determine a second RC time constant of the RC clamp device to reduce the overall layout area of the RC clamp device, the first time constant configured to accommodate HBM electrostatic discharge (ESD) and the second RC time constant configured to accommodate CDM-ESD;

means for distributing power, the RC clamp device and the sub-RC clamp components being arranged along the power distributing means, the first RC time constant being different from the second RC time constant, the first and second RC time constants defined based at least in part on first and second resistance and capacitance values, respectively, in which the first resistance and capacitance values are larger relative to the second resistance and capacitance values, the first RC time constant defined to reflect a slower rise time relative to the second RC time constant;

means for turning on components configured according to the HBM model and a means for turning on the sub-RC clamp components to shunt high current initially experienced by the RC clamp device; and means for turning off the components configured according to the HBM model after the initial experience of the high current by the RC clamp device to continue shunting the current through the sub-RC clamp components.

8. The passive mixed mode RC clamp device system of claim 7, in which the first clamping means comprises another means for clamping a voltage having a third RC time constant.

9. The passive mixed mode resistor-capacitor (RC) clamp device system of claim 7, in which the first clamping means and the second clamping means each comprise means for switching electrical signals, the switching means for having a variable layout area.

10. The passive mixed mode resistor-capacitor (RC) clamp device system of claim 7, integrated into a mobile phone, a set top box, a music player, a video player, an entertainment unit, a navigation device, a computer, a hand-held personal communication systems (PCS) unit, a portable data unit, and/or a fixed location data unit.

\* \* \* \* \*